(12) United States Patent
Vellianitis et al.

(10) Patent No.: US 9,287,414 B2
(45) Date of Patent: Mar. 15, 2016

(54) INTEGRATED CIRCUIT

(75) Inventors: Georgios Vellianitis, Redhill (GB);
Gilberto Curatola, Redhill (GB);
Kyriaki Fotopoulou, Redhill (GB);
Nader Akil, Redhill (GB)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 360 days.

(21) Appl. No.: 13/499,805

(22) PCT Filed: Oct. 21, 2010

(86) PCT No.: PCT/IB2010/054770
§ 371 (c)(1),
(2), (4) Date: Apr. 2, 2012

(87) PCT Pub. No.: WO2011/048567
PCT Pub. Date: Apr. 28, 2011

(65) Prior Publication Data
US 2012/0199937 A1    Aug. 9, 2012

(30) Foreign Application Priority Data

Oct. 22, 2009  (EP) .................................... 09173771

(51) Int. Cl.
| | | |
|---|---|---|
| *H01L 29/872* | (2006.01) | |
| *H01L 21/20* | (2006.01) | |
| *H01L 29/66* | (2006.01) | |
| *H01L 27/06* | (2006.01) | |
| *H01L 29/08* | (2006.01) | |

(52) U.S. Cl.
CPC ........ *H01L 29/872* (2013.01); *H01L 29/66143* (2013.01); *H01L 27/0629* (2013.01); *H01L 29/083* (2013.01)

(58) Field of Classification Search
CPC ....... H01L 29/47; H01L 21/20; H01L 21/329; H01L 29/872; H01L 29/66143; H01L 29/083; H01L 27/0629
USPC .......................................................... 257/471
See application file for complete search history.

(56) References Cited

U.S. PATENT DOCUMENTS

| | | | |
|---|---|---|---|
| 5,696,025 A | 12/1997 | Violette et al. | |
| 6,949,454 B2 * | 9/2005 | Swanson et al. | 438/570 |
| 2006/0125019 A1 * | 6/2006 | Levin et al. | 257/369 |
| 2007/0052057 A1 * | 3/2007 | Drobny | 257/471 |

(Continued)

FOREIGN PATENT DOCUMENTS

| | | |
|---|---|---|
| EP | 1229491 A | 8/2002 |
| JP | 2008085199 A | 4/2008 |
| WO | 2008107263 A | 9/2008 |

OTHER PUBLICATIONS

International Search Report dated Jan. 24, 2011.

*Primary Examiner* — Evan Pert
*Assistant Examiner* — Damon Hillman
(74) *Attorney, Agent, or Firm* — McClure, Qualey & Rodack, LLP

(57) ABSTRACT

An integrated circuit including a Schottky diode, and a method of making the same. The diode includes an active region bordered by an isolation region in a semiconductor substrate of the integrated circuits, a first electrode having a metal contact provided on a surface of the active region, and a second electrode having a silicide contact also provided on the surface of the active region.

17 Claims, 4 Drawing Sheets

(56) References Cited

U.S. PATENT DOCUMENTS

| | | |
|---|---|---|
| 2007/0139164 A1 | 6/2007 | O'Toole et al. |
| 2009/0194838 A1* | 8/2009 | Pendharkar et al. .......... 257/476 |
| 2009/0283841 A1* | 11/2009 | Yeh et al. ...................... 257/384 |
| 2010/0148253 A1* | 6/2010 | Tu et al. ........................ 257/337 |

* cited by examiner

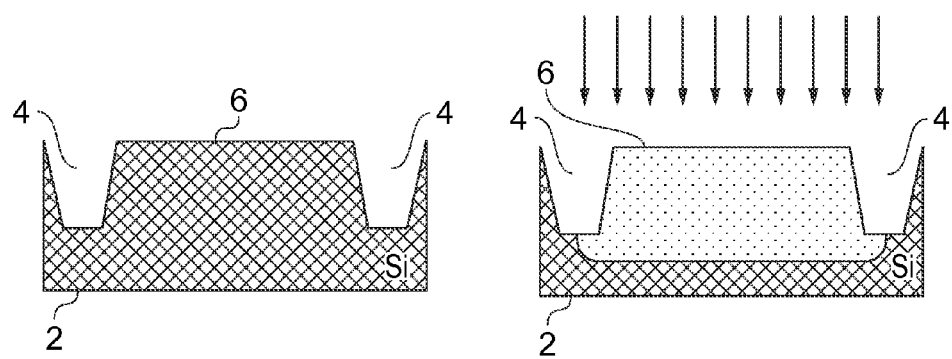
FIG. 4A
FIG. 4B
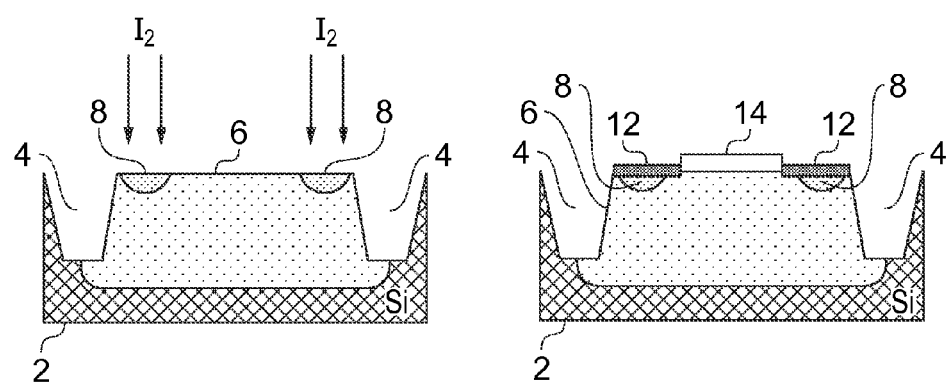
FIG. 4C
FIG. 4D
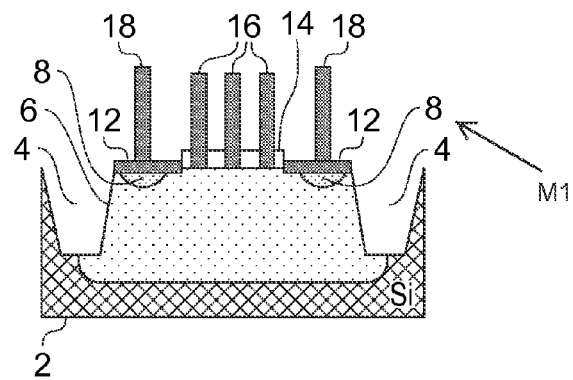
FIG. 4E

US 9,287,414 B2

INTEGRATED CIRCUIT

CROSS-REFERENCE TO RELATED APPLICATION

This application is the 35 U.S.C. §371 national stage of PCT application "Integrated Circuit," having serial number PCT/IB2010/054770, filed on Oct. 21, 2010 which claims priority to and benefit of European Patent Application No. 09173771.8, filed on Oct. 22, 2009, both of which are incorporated by reference in their entireties.

BACKGROUND OF THE INVENTION

This invention relates to an integrated circuit and to a method of making an integrated circuit.

Diodes are well known the art for their rectifying properties, whereby current is allowed to pass only in a single direction through the device. With reference to FIGS. 1A and 1B, the properties of the ideal diode and a typical real-world diode are briefly compared.

As shown in FIG. 1A, for V>0 (forward bias), the current in the ideal electrode is essentially an exponential function of V, while for V<0 (reverse bias), no current is allowed to flow through the device.

As is well known, the behaviour of a typical real-world diode deviates from the ideal shown in FIG. 1A in three main ways. These deviations are illustrated in FIG. 1B.

In particular, FIG. 1B shows that below a characteristic forward bias switch-on voltage $V_f$, the current flowing through the diode for V>0 remains substantially at zero. The current in the device rises exponentially above $V_f$. An alternative way of viewing the behaviour of the ideal diode shown in FIG. 1A is to treat $V_f$ as essentially equal to zero.

Also, as shown in FIG. 1B, for V<0, a small reverse current (reverse bias leakage current $I_{RB}$) flows through the diode, such that the diode does not act as a perfect rectifier (current may pass through the diode in either direction, but is limited to $I_{RB}$ in the reverse direction).

Further, as shown in FIG. 1B, and as is also well known, typical real-world diodes exhibit large reverse breakdown currents below a certain reverse bias voltage V<$V_{BR}$.

The values of $V_f$, $I_{RB}$, and $V_{BR}$ depend on the design of the diode, and can be tailored according to design requirements by altering parameters such as the doping levels and work functions of the materials used within the device.

For certain applications, such as in rectifiers for low amplitude AC signals and/or in charge pump circuits, it is desirable to use diodes that have a low value of $V_f$.

For example, to rectify an AC signal with a small amplitude, a small $V_f$ is necessary in order to have any output signal ($V_f$ should be smaller than the AC signal amplitude).

A more specific example is the charge pump circuit, which can be used for rectification and amplification purposes in an RFID tag. Such a circuit receives a small AC signal with amplitude Vin and rectifies/amplifies it to a value of:

$$V_{out} = 2 \cdot n \cdot (V_{in} - V_f) \quad (1)$$

where n is the number of charge pump circuits (stages) in series.

From equation (1) it can be seen that in order to have an output voltage, $V_f$ should be lower than $V_{in}$. Taking into account that $V_{in}$ depends on the distance between RF signal emitter and receiver (the longer the distance between them, the smaller the $V_{in}$), having a low $V_f$ implies that the RFID can operate at even greater distances. Furthermore, even at a fixed distance between RFID tag and RF signal emitter, a low $V_f$ implies higher power efficiency (how much of the input signal will pass through the diode).

For applications such as those mentioned above, Schottky diodes, which typically do have low values of $V_f$, are therefore particularly suitable. As is well known, Schottky diodes typically include a metal-semiconductor junction, which forms the basis for the rectifying action of the diode.

To reduce costs and allow easy integration with other devices, it is desirable to be able to fabricate Schottky diodes using existing CMOS processing steps.

However, it is difficult to integrate the provision of a metal-semiconductor contact into existing CMOS process flows. For example, with some exceptions (in highly advanced, more expensive process flows), metal is excluded from use in Front End Of Line (FEOL) wafer processing.

Accordingly, the provision of a Schottky diode into integrated circuit chips or dies manufactured by CMOS processing (e.g. for incorporation into the die of an RFID tag) is difficult to achieve.

SUMMARY OF THE INVENTION

Aspects of the invention are set out in the accompanying independent and dependent claims. Combinations of features from the dependent claims may be combined with features of the independent claims as appropriate and not merely as explicitly set out in the claims.

According to an aspect of the invention, there is provided an integrated circuit including a Schottky diode. The diode comprises an active region bordered by an isolation region in a semiconductor substrate of the integrated circuit. The diode also comprises a first electrode comprising a metal contact provided on a surface of the active region. The diode further comprises a second electrode comprising a silicide contact also provided on said surface of said active region.

According to another aspect of the invention, there is provided a method of making an integrated circuit including a Schottky diode. The method comprises providing a semiconductor substrate. The method also comprises providing an isolation region in the substrate, wherein the isolation borders an active region of the substrate. The method further comprises forming a metal contact on a surface of the active region to provide a first electrode of the diode. The method also comprises forming a silicide contact on said surface of said active region to provide a second electrode of the diode.

The invention allows the provision of a Schottky diode in an integrated circuit, using a novel combination of standard CMOS processing techniques. Accordingly, manufacture of the diode can be integrated into middle or back end of line process flows.

In one embodiment, the isolation region comprises shallow trench isolation.

In one embodiment, the active region can include a doped well. The first and second electrodes in this example can be provided on the surface of the active region above the doped well. The doped well can be formed by ion implantation.

In one embodiment, a portion of the surface of the active region is covered by a protection layer comprising, for example, a nitride layer. In this example, the metal contact can extend through an opening (formed by, for example, an etching process) in the protection layer, to meet the surface of the active region. The silicide contact can be provided on an exposed portion of the surface of the active region that is not covered by the protection layer. The protection layer serves to protect the non-exposed portions of the surface from the silicidation process.

In one example, the diode can include a portion of semiconductor material located in the active region, adjacent the edges of the metal contact of the first electrode. This can reduce leakage current at the edges of the metal contact. In this example, the portion of semiconductor material can be more highly doped than the remainder of the active region. The portion of semiconductor material can also have a conductivity type opposite to that of the remainder of the active region. The portion of semiconductor material adjacent can form a closed ring around the metal contact, again minimising leakage currents.

The metal contact of the first electrode can comprise a portion of an interconnect level of the substrate. In this way, the output characteristics of the Schottky diode can be tailored by selecting the metal composition used for interconnects. The metal composition of the interconnect determines the work function of the first electrode, thus influencing factors such as the switch on voltage $V_f$ of the diode. The interconnect level can be a local interconnect level of the substrate, or a lowest metal interconnect level (M1) of the substrate. This conveniently allows the manufacture of the diode to be integrated in middle end or back end of line process flows.

According to a further aspect of the invention, there is provided an RFID tag including an integrated circuit of the kind described above.

According to another aspect of the invention, there is provided a method of making an RFID tag. The method includes the method described above for making an integrated circuit of the RFID tag.

BRIEF DESCRIPTION OF THE DRAWINGS

Embodiments of the present invention will be described hereinafter, by way of example only, with reference to the accompanying drawings in which like reference signs relate to like elements and in which:

FIGS. 4A-4E schematically illustrate the various stages in a process flow for making an integrated circuit in accordance with a further embodiment of the invention.

DETAILED DESCRIPTION

Embodiments of the present invention are described in the following with reference to the accompanying drawings.

This invention can provide an integrated circuit comprising a diode, such as a Schottky diode, which can be manufactured using standard CMOS processing techniques. In particular, a diode in accordance with this invention can be manufactured as part of a middle or back end of line process flow.

A first embodiment of a method for making an integrated circuit comprising a Schottky diode is described below in relation to FIG. 2.

In a first stage of the method, there is provided a semiconductor substrate 2. The substrate 2 may comprise any suitable material, for example silicon. Trenches 4 are formed in a major surface of the substrate 2 using, for example, one or more conventional masking and etching steps. The trenches 4 may be filled with an insulating material. The trenches 4 may, for example, be shallow trench isolation (STI) trenches.

In this example, the trenches 4 define an active region 6 of the substrate 2. The active region 6 is bordered by the trenches 4, which can constitute an isolation region in the substrate 2, isolating the active region 6 from other parts of the substrate 2. In plan view, the active region 6 bordered by the trenches 4 may have a substantially oblong shape, although other shapes may also be used (for example, hexagonal, square, circle etc.).

Turning to FIG. 2, following formation of the trenches 4 to define the active region 6 a well implantation step $I_1$ is performed, to dope the active region 6. Either n-type or p-type doping may be used, according to design requirements for the diode.

Figure 1A:
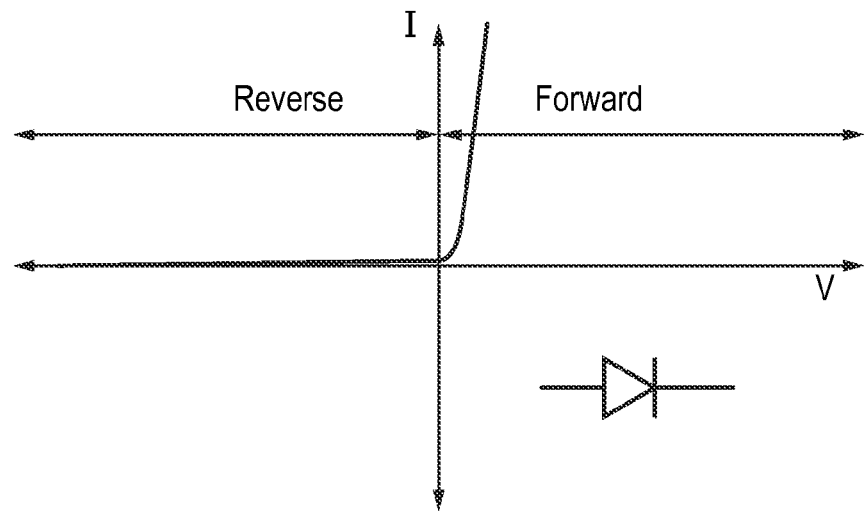
FIG. 1A schematically illustrates the behaviour of an ideal diode.
Figure 1B:
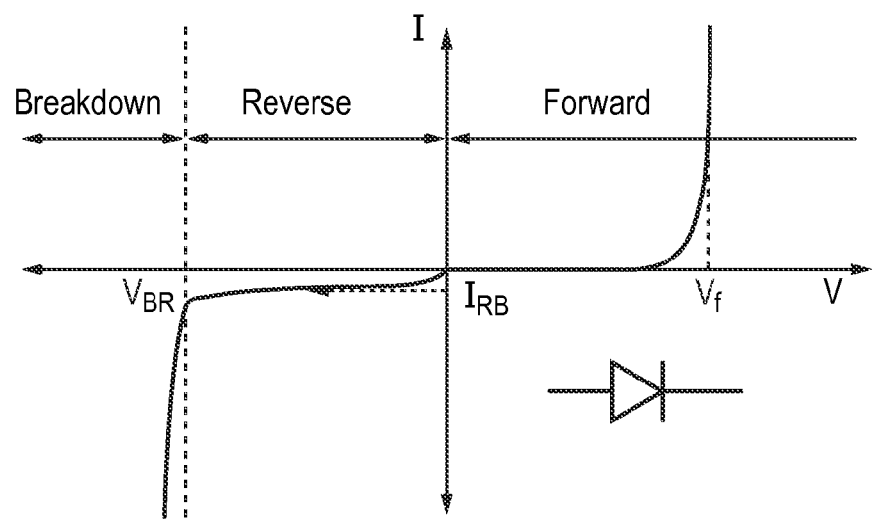
FIG. 1B schematically illustrates the behaviour of a typical real-world diode, for comparison with the ideal diode behaviour shown in FIG. 1A.
Figure 2A:
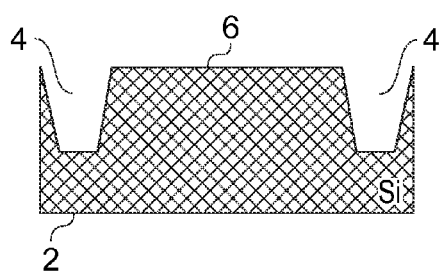
FIGS. 2A-2E schematically illustrate the various stages in a process flow for making an integrated circuit in accordance with an embodiment of the invention.
Figure 2B:
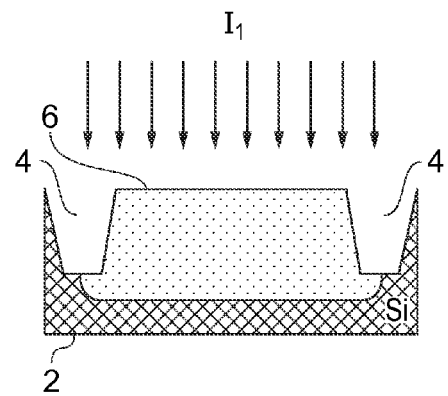
Figure 2C:
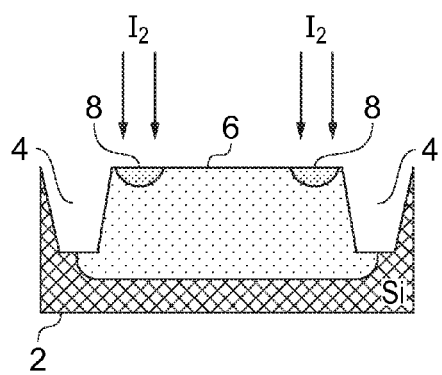
Figure 2D:
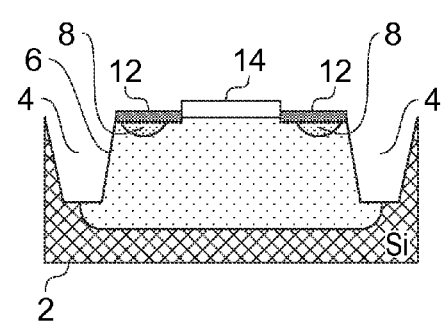

As shown in FIG. 2c, a further implantation step $I_2$ is then performed, to form doped contact implants 8. Typically, the contact implants 8 will have a conductivity type that is the same as that of the doped active region 6. However, the contact implant 8 can be doped to a higher level than the remainder of the active region 6, thereby to enable silicidation to ensure the provision of ohmic contacts.

A protection layer 14 is then formed on the surface of the active region 6. This layer 14 protects the surface of the active region 6 during the subsequent silicidation step. In this example, the protection layer 14 is formed in a gap in between the contact implants 8. The protection layer 14 may, for example, comprise a nitride layer. Thereafter, the contact implants 8 are silicidated to form the silicide contacts 12.

Figure 2E:
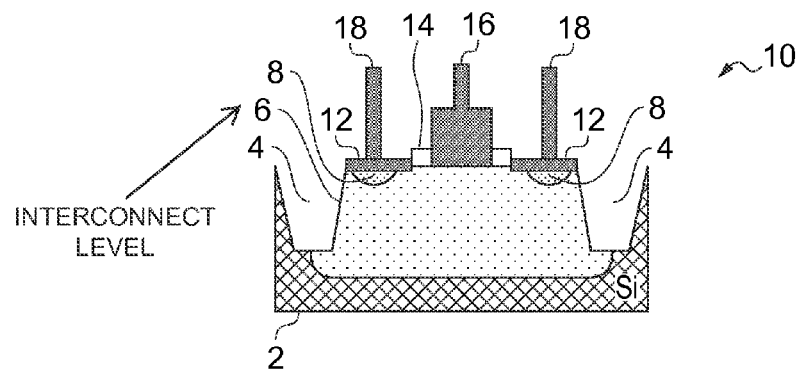

In a further step shown in FIG. 2e, metal contacts 16 and 18 are formed. The contacts 18 connect to the silicide contacts 12, while the contact 16 makes direct contact with the surface of the doped active region 6. The contact 16 passes through an opening provided in the protection layer 14. The opening can be formed using, for example, an etching step.

All of the method steps described above can be incorporated into standard CMOS process flows in the middle or back end of line.

Accordingly, a diode according to an embodiment of the invention can comprise a semiconductor substrate 2 having an active region 6 that is bordered by an isolation region (such as the trenches 4). A first electrode 16 of the diode comprises a metal contact that is provided on a surface of the active region 6. A second electrode of the diode comprises a silicide contact 12 that is also provided on the surface of the active region 6.

A second embodiment of a method according to this invention is described below in relation to FIG. 3.

Figure 3A:
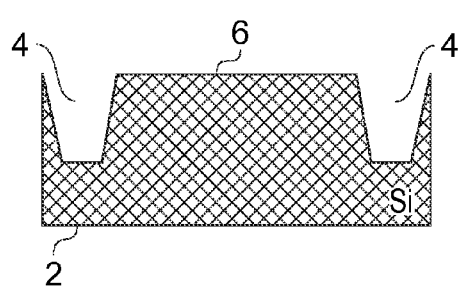
FIGS. 3A-3F schematically illustrate the various stages in a process flow for making an integrated circuit in accordance with another embodiment of the invention.
Figure 3B:
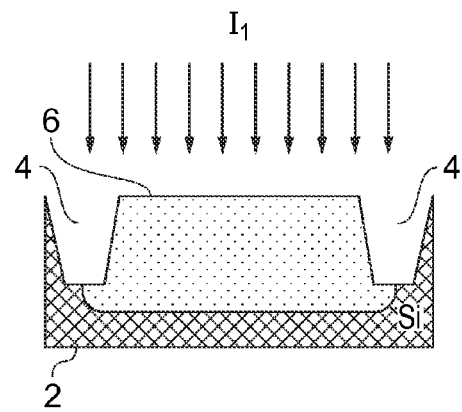
Figure 3C:
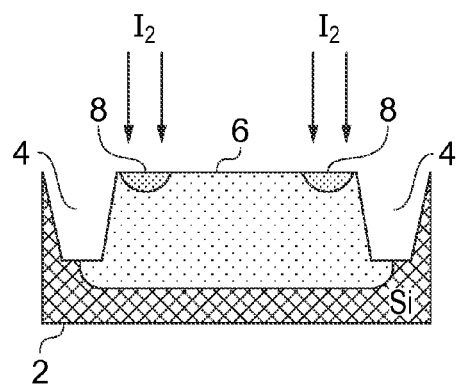
Figure 3D:
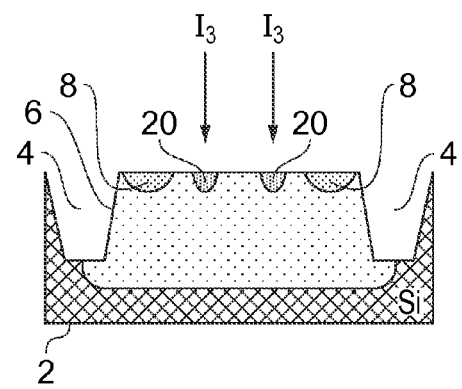

As shown in FIGS. 3a, 3b and 3c, the initial stages of the second embodiment are substantially the same as those described above in relation to FIGS. 2a, 2b and 2c. However, in this second embodiment, a third implantation step $I_3$ is performed to form a semiconductor portion 20, which has a conductivity type which is opposite to the conductivity type of the doped active portion 6. The semiconductor portion 20 in this example is located in between the contact implants 8. The semiconductor portion 20 may also have a higher doping level than the remainder of the active region 6.

Figure 3E:
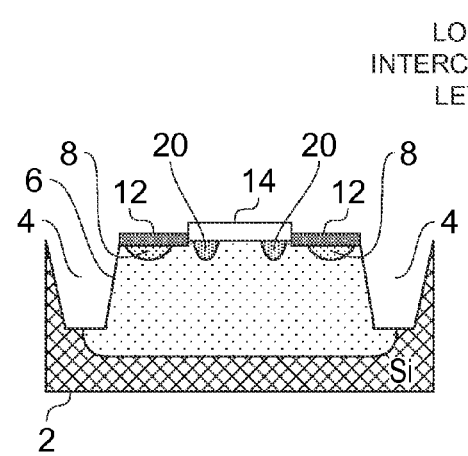

Subsequently, and as described above in relation to FIG. 2d, a protection layer 14 is formed, and silicide contacts 12 are provided. The result of this stage is shown in FIG. 3e.

Figure 3F:
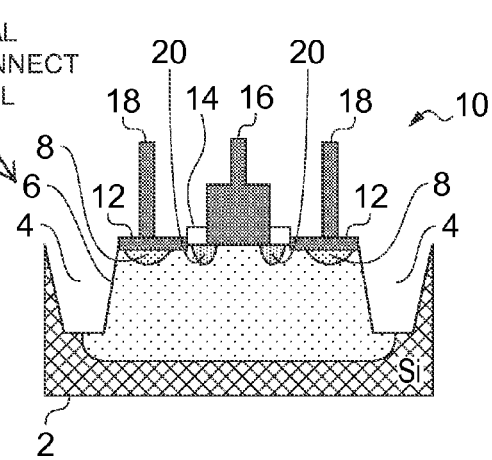

Turning to FIG. 3f, it is shown that metal contacts 18, 16 are then provided as described above in relation to FIG. 2e. In this example, the portion of semiconductor material 20 is provided adjacent the edges of the metal contact 16. The provision of the portion of semiconductor material 20 having a conductivity type opposite to that of the remainder of the active region 6 aids in reducing leakage currents. In particular the junction between the active region 6 (which has a first conductivity type) and the portion 20 (which has a conductivity type opposite to the first conductivity type) blocks such leakage currents. The portion of semiconductor material 20 can substantially surround the metal contact 16 in the region at which the metal contact 16 meets the surface of the active region 6, forming a closed ring. Moreover, the portion of semiconductor material 20 can overlap the edges of the metal contact 16. This enhances the ability of the portion of semiconductor material 20 to inhibit leakage currents, since extra leakage currents normally arise from the Schottky contact edges.

The metal contact 16 can, in accordance with an embodiment of the invention, be provided as part of an interconnect level of the integrated circuit. The interconnect level can, for example, comprise a local interconnect level (LIL) of the integrated circuit. The local interconnect level is typically provided as part of standard of back end of line processing. Since the use of metal is normally prohibited during front end of line of processing, this invention conveniently allows the formation of a metal Schottky contact, using standard CMOS processing, in which the standard local interconnect level metallisation process can be employed to provide the necessary metal contacts of the diode.

A third embodiment of the invention is described below in relation to FIG. 4. In this third embodiment, the initial stages are substantially the same as those described above in relation to FIGS. 2a to 2d.

Some back end of line process flows do not include the provision of a local interconnect level. In such examples, instead of using the local interconnect level to provide the necessary metal for the diode, a lower (for example, lowest) metal level (M1) can be used instead. This is shown in FIG. 4O, where the metal contacts 16 form part of the lowest metal level M1. As is shown, multiple contacts 16 may be provided, and the number of contacts is limited primarily by the amount of space that is provided on the surface of the active region 6 in between the silicide contacts 12.

In embodiments in which an interconnect level (for example, either a local interconnect level or a lower metal level) of the integrated circuit is used the switch output characteristics of the Schottky diode can be tailored by selecting the metal composition used for the interconnects. The metal composition of the interconnect determines the work function of the first electrode, thus influencing factors such as the switch on voltage $V_f$ of the diode. Examples of materials that can be used for the interconnect level include Ti and Co. These can be used to form TiSi, $TiSi_2$, and $CoSi_2$ contacts.

Accordingly, there has been described a diode and a method of making the same. The diode includes a semiconductor substrate having an active region bordered by an isolation region, a first electrode having a metal contact provided on a surface of the active region, and a second electrode having a silicide contact also provided on the surface of the active region.

Although particular embodiments of the invention have been described, it will be appreciated that many modifications/additions and/or substitutions may be made within the scope of the claimed invention.

The invention claimed is:

1. An integrated circuit including a Schottky diode, the diode comprising:
    an active region bordered by an isolation region in a semiconductor substrate of the integrated circuit, wherein a portion of the surface of the active region is covered by a protection layer;
    a first electrode comprising a first metal contact directly in contact with a surface of the active region such that an intervening silicide contact is not connected between the first metal contact and the active region, wherein the first metal contact extends through the protection layer to meet the surface of the active region; and
    a second electrode comprising a second metal contact and a silicide contact in direct contact therewith, the silicide contact of the second electrode being in direct contact with the surface of the active region, wherein the silicide contact is provided on an exposed portion of the surface of the active region not covered by the protection layer.

2. The integrated circuit of claim 1, wherein the isolation region comprises shallow trench isolation.

3. The integrated circuit of claim 1, wherein the active region comprises a doped well, and wherein the first and second electrodes are provided on the surface of the active region above the doped well.

4. The integrated circuit of claim 1, comprising a portion of semiconductor material located in the active region and adjacent the edges of the metal contact of the first electrode, for reducing leakage current at said edges, wherein the portion of semiconductor material is doped to have a conductivity type opposite to that of the remainder of the active region.

5. The integrated circuit of claim 4, wherein portion of semiconductor material adjacent the edges of the first metal contact of the first electrode forms a closed ring around the first metal contact.

6. The integrated circuit of claim 1, wherein the first metal contact of the first electrode comprises a portion of an interconnect level of the substrate.

7. The integrated circuit of claim 6, wherein the interconnect level is a local interconnect level of the substrate.

8. The integrated circuit of claim 6, wherein the interconnect level is a lowest metal interconnect level (M1) of the substrate.

9. An RFID tag including the integrated circuit of claim 1.

10. A method of making an integrated circuit including a Schottky diode, the method comprising:
    providing a semiconductor substrate;
    providing an isolation region in the substrate, wherein the isolation borders an active region of the substrate;
    covering a portion of the surface of the active region with a protection layer;
    forming a first metal contact directly in contact with a surface of the active region to provide a first electrode of the diode, wherein the first metal contact extends through the protection layer to meet the surface of the active region without an intervening silicide contact being positioned therebetween;
    forming a silicide contact on said surface of said active region, wherein the silicide contact is formed on an exposed portion of the surface of the active region not covered by the protective layer of semiconductor material; and
    forming a second metal contact directly in contact with the silicide contact to provide a second electrode of the diode.

11. The method of claim 10, comprising:
    forming a portion of semiconductor material in the active region corresponding to an intended configuration of the first metal contact of the first electrode, wherein the portion of semiconductor material is has a conductivity type opposite to that of the remainder of the active region; and forming said first metal contact such that the portion of semiconductor material is positioned adjacent the edges of the metal contact, for reducing leakage current at said edges.

12. The method of claim 10, comprising forming an interconnect level of the substrate, wherein the first metal contact of the first electrode is formed during the same processing step as the formation of the interconnect level.

13. The method of claim 12, wherein the interconnect level is a local interconnect level of the substrate.

14. The method of claim 12, wherein the interconnect level is a lowest metal interconnect level (M1) of the substrate.

15. A method for making an RFID tag, the method including the method of making an integrated circuit including a Schottky diode for making an integrated circuit of the RFID tag, the method comprising:
    providing a semiconductor substrate;
    providing an isolation region in the substrate, wherein the isolation borders an active region of the substrate;
    covering a portion of the surface of the active region with a protection layer;
    forming a first metal contact directly in contact with a surface of the active region to provide a first electrode of the diode, wherein the metal contact extends through the protection layer to meet the surface of the active region without an intervening silicide contact being positioned between the first metal contact and the active region;
    forming a silicide contact on said surface of said active region, wherein the silicide contact is formed on an exposed portion of the surface of the active region not covered by the protective layer of semiconductor material; and
    forming a second metal contact directly in contact with the silicide contact to provide a second electrode of the diode.

16. The method of claim 15, comprising:
    forming a portion of semiconductor material in the active region corresponding to an intended configuration of the first metal contact of the first electrode, wherein the portion of semiconductor material is has a conductivity type opposite to that of the remainder of the active region; and
    forming said first metal contact such that the portion of semiconductor material is positioned adjacent the edges of the metal contact, for reducing leakage current at said edges.

17. The method of claim 15, comprising forming an interconnect level of the substrate, wherein the first metal contact of the first electrode is formed during the same processing step as the formation of the interconnect level.

* * * * *

UNITED STATES PATENT AND TRADEMARK OFFICE
CERTIFICATE OF CORRECTION

PATENT NO.       : 9,287,414 B2                                         Page 1 of 1
APPLICATION NO.  : 13/499805
DATED            : March 15, 2016
INVENTOR(S)      : Vellianitis et al.

It is certified that error appears in the above-identified patent and that said Letters Patent is hereby corrected as shown below:

Title Page, Item (54) and in the Specification, column 1, line 1: Add -- with Schottky Diodes and Related Methods of Manufacture -- immediately following "Integrated Circuits".

Signed and Sealed this
Seventeenth Day of May, 2016

Michelle K. Lee
*Director of the United States Patent and Trademark Office*